United States Patent
Arai et al.

(10) Patent No.: US 10,593,467 B2
(45) Date of Patent: Mar. 17, 2020

(54) PASSIVE COMPONENT AND ELECTRONIC DEVICE

(71) Applicant: TAIYO YUDEN CO., LTD., Chuo-ku, Tokyo (JP)

(72) Inventors: Takayuki Arai, Takasaki (JP); Masanori Nagano, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/366,969

(22) Filed: Mar. 27, 2019

(65) Prior Publication Data
US 2019/0304666 A1  Oct. 3, 2019

(30) Foreign Application Priority Data
Mar. 29, 2018 (JP) .................. 2018-065809

(51) Int. Cl.
*H01F 27/29* (2006.01)
*H01F 27/28* (2006.01)
*H05K 1/11* (2006.01)
*H05K 1/18* (2006.01)

(52) U.S. Cl.
CPC ....... *H01F 27/292* (2013.01); *H01F 27/2804* (2013.01); *H05K 1/111* (2013.01); *H05K 1/181* (2013.01); *H01F 2027/2809* (2013.01); *H05K 2201/1003* (2013.01)

(58) Field of Classification Search
CPC ........ H01G 4/005; H01G 4/228; H01G 4/236; H01G 4/248; H01G 4/232; H01F 41/069; H01F 2017/002; H01F 27/29; H01F 27/292; H01F 27/2804; H01L 23/5227

USPC ................. 361/302, 303, 306.3, 307; 336/65
See application file for complete search history.

(56) References Cited

U.S. PATENT DOCUMENTS

| | | | | |
|---|---|---|---|---|
| 6,407,907 | B1 * | 6/2002 | Ahiko | H01G 4/232 257/E23.173 |
| 6,606,237 | B1 * | 8/2003 | Naito | H01G 4/232 361/303 |
| 2008/0080120 | A1 * | 4/2008 | Togashi | H01G 4/012 361/301.4 |
| 2009/0116168 | A1 * | 5/2009 | Block | H01C 1/148 361/306.3 |
| 2011/0102971 | A1 * | 5/2011 | Itamura | H01G 4/12 361/321.2 |

(Continued)

FOREIGN PATENT DOCUMENTS

JP  2000348939 A  12/2000

*Primary Examiner* — Roshn K Varghese
(74) *Attorney, Agent, or Firm* — Law Office of Katsuhiro Arai

(57) ABSTRACT

In an exemplary embodiment, a passive component which is a surface mounting component, includes: a substrate body 10 having insulation property; an internal conductor 50 embedded in the substrate body 10; and an external electrode 70 provided on the bottom face 12, which is the mounting surface, of the substrate body 10 and electrically connected to the internal conductor 50; wherein the external electrode 70 has a face 86 roughly parallel with the bottom face 12 of the substrate body 10, and a dome-shaped projection 80 that bulges, with reference to the roughly parallel face 86, away from the bottom face 12 of the substrate body 10. The passive component can prevent misalignment problems at mounting.

10 Claims, 14 Drawing Sheets

(56) References Cited

U.S. PATENT DOCUMENTS

| | | | | |
|---|---|---|---|---|
| 2016/0049253 A1* | 2/2016 | Mukobata | ................ | H01G 4/30 |
| | | | | 361/301.4 |
| 2017/0098505 A1* | 4/2017 | Ando | ..................... | H01G 4/005 |
| 2018/0190435 A1* | 7/2018 | Kishi | ..................... | H01G 4/308 |
| 2018/0323010 A1* | 11/2018 | Park | ..................... | H05K 3/3442 |
| 2019/0066925 A1* | 2/2019 | Satoh | ..................... | H01G 4/248 |

* cited by examiner

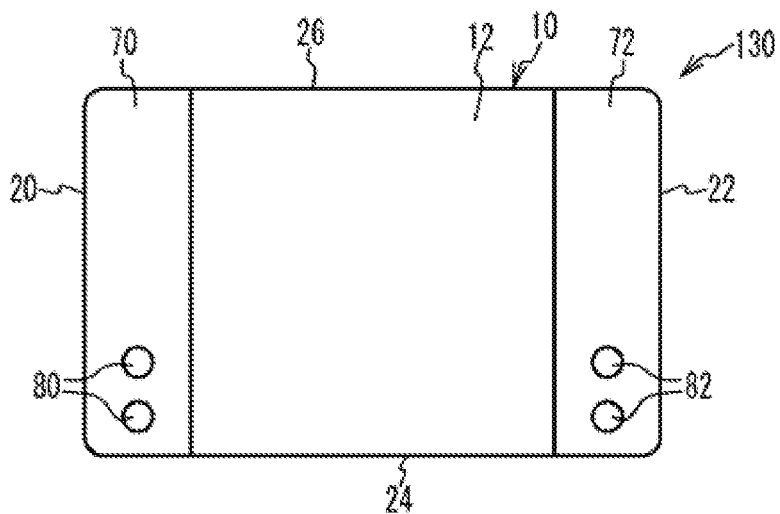
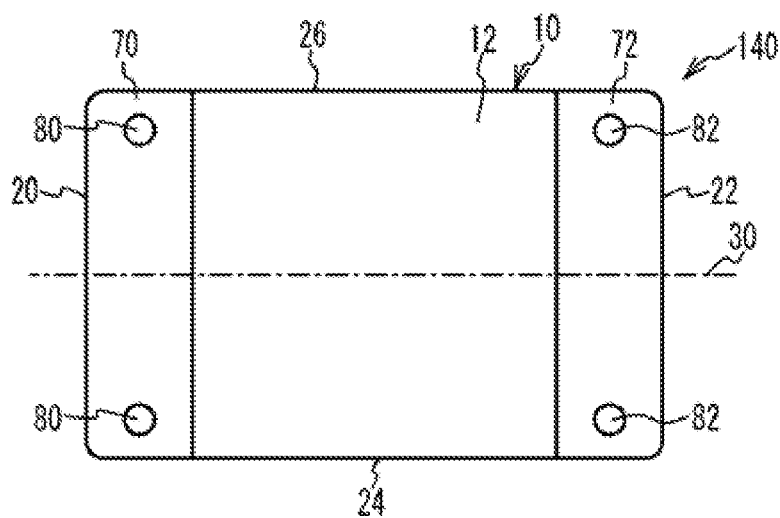
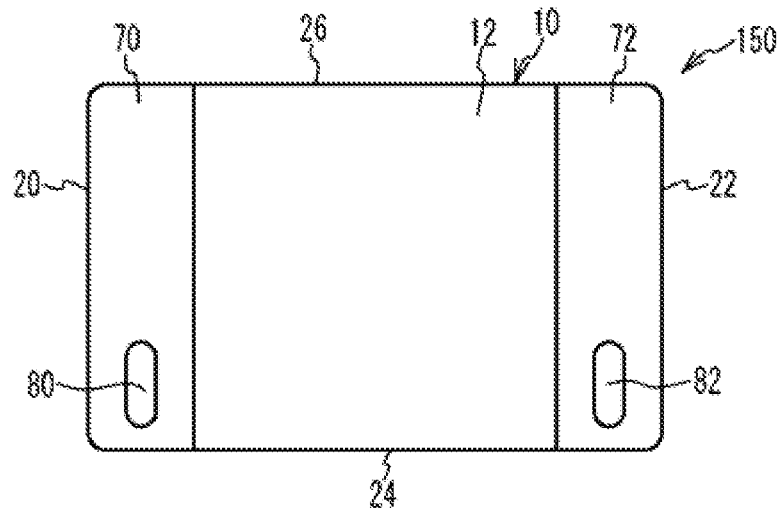

PASSIVE COMPONENT AND ELECTRONIC DEVICE

BACKGROUND

Field of the Invention

The present invention relates to a passive component and an electronic device.

Description of the Related Art

As electronic devices become increasingly smaller, there are calls for making the passive components in electronic devices smaller and reducing the footprints of passive components on circuit boards. For example, multi-layer inductors have been proposed, each comprising a laminate and a coil whose two end parts are led out to the mounting surface of the laminate, with these two end parts of the coil connected to the external electrodes provided on the mounting surface, in order to prevent formation of solder fillets and achieve excellent electrical characteristics (refer to Patent Literature 1, for example).

Background Art Literatures

[Patent Literature 1] Japanese Patent Laid-open No. 2000-348939

SUMMARY

Passive components are mounted on circuit boards using solder supplied onto the land patterns on the circuit boards. Circuit boards are becoming more densely mounted. This means that passive components are made smaller and more lightweight, and to support these smaller passive components, land patterns on circuit boards become smaller, and smaller amounts of solder are supplied onto the land patterns, which makes the passive components prone to shifting out of their specified positions and causing misalignment problems as they are mounted onto the circuit boards. For example, circuit boards of the monohedral electrode structure are sometimes used, wherein the external electrodes are formed only on the mounting surface of the substrate body, with the aim of reducing the footprints of passive components on the circuit boards. In this case, however, the land patterns on the circuit boards become further smaller and the supplied amounts of solder decrease further, which makes it easier for the passive components to shift out of their specified positions.

The present invention was developed in light of the aforementioned problems, and its object is to prevent misalignment problems at mounting.

Any discussion of problems and solutions involved in the related art has been included in this disclosure solely for the purposes of providing a context for the present invention, and should not be taken as an admission that any or all of the discussion were known at the time the invention was made.

This invention is a passive component being a surface mounting component, comprising: a substrate body having insulation property; an internal conductor embedded in the substrate body; and an external electrode provided on the mounting surface of the substrate body and electrically connected to the internal conductor; wherein the external electrode has a face roughly parallel with the mounting surface of the substrate body, and a dome-shaped projection that bulges outward from the mounting surface of the substrate body.

The aforementioned constitution may be such that the projection represents a spherical bulge.

The aforementioned constitution may be such that the external electrode has multiple projections that each correspond to the aforementioned projection.

The aforementioned constitution may be such that multiple external electrodes, each corresponding to the aforementioned external electrode having the projection, are provided on the mounting surface of the substrate body.

The aforementioned constitution may be such that the projection of the first external electrode, and the projection of the second external electrode, among the multiple external electrodes, are provided at positions symmetrical to each other across the center of the mounting surface of the substrate body.

The aforementioned constitution may be such that the mounting surface of the substrate body has a pair of short sides and a pair of long sides, and the projection of the first external electrode, and the projection of the second external electrode, among the multiple external electrodes, are provided at positions symmetrical to each other across the center line running through the respective centers of the pair of long sides of the mounting surface of the substrate body.

The aforementioned constitution may be such that the external electrode is formed by materials that contain nickel.

The aforementioned constitution may be such that the external electrode has the projection at a position away from the sides constituting the mounting surface of the substrate body.

The aforementioned constitution may be such that the internal conductor has a lead conductor led out to the mounting surface of the substrate body and connected to the external electrode, wherein the end part of the lead conductor projects from the mounting surface of the substrate body and the projection is formed as a result of the external electrode covering the end part of the lead conductor.

The aforementioned constitution may be such that the lead conductor is led out to the mounting surface of the substrate body after branching into multiple conductors, wherein the respective end parts of the multiple conductors project from the mounting surface of the substrate body and the projections are formed as a result of the external electrode covering the respective end parts of the multiple conductors.

The present invention is an electronic device comprising: any of the passive components described above; and a circuit board having a land pattern; wherein the external electrode of the passive component is joined to the land pattern of the circuit board using solder.

According to the present invention, misalignment problems can be prevented at mounting.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1A is a perspective view, while

FIGS. 2A to 2D are views of cross-section A-A to cross-section D-D in

FIG. 1B, respectively.

FIGS. 4A and 4B are cross-sectional views, while

FIGS. 5A and 5B are cross-sectional views, while

FIGS. 6A to 6C are plan views showing the bottom faces, as viewed transparently from the top face sides, of the coil components pertaining to Variation Example 3 to Variation Example 5 of Example 1.

FIG. 7B is a top transparent view, while

FIG. 10A is a perspective view of the coil component pertaining to Example 3, while

FIG. 12A is a perspective view of the coil component pertaining to Example 4, while

FIG. 13A is a perspective view of the capacitor component pertaining to Example 5, while

DESCRIPTION OF THE SYMBOLS

Figure 1A:
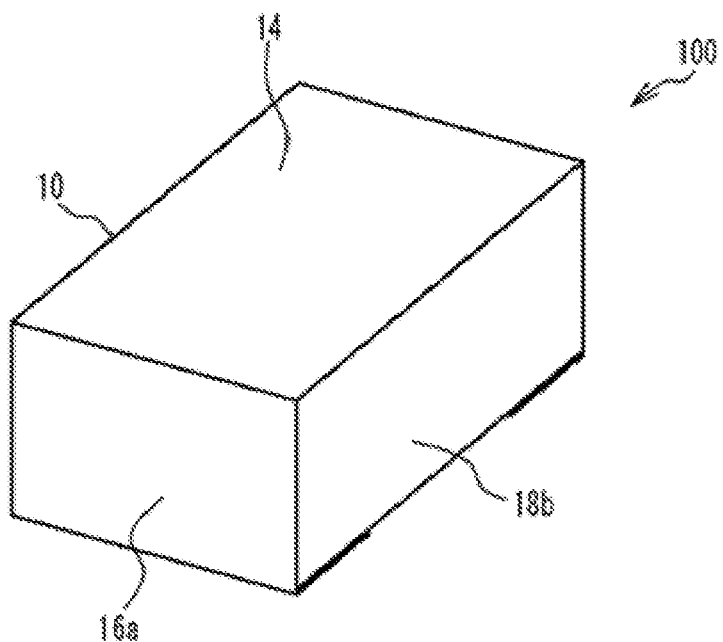

10 Substrate body
12 Bottom face
14 Top face
16a, 16b End face
18a, 18b Side face
20, 22, 24, and 26 Side
28, 30 Center line
32 Center
50 to 50d Internal conductor
52 to 52c Coil conductor
54 to 54c Lead conductor
56 to 56c Lead conductor
58a to 58c Conductor
60 Capacitor conductor
62a, 62b Lead conductor
70 to 70d External electrode
72 to 72d External electrode
80 to 80d Projection
82 to 82d Projection
84 Inner area of projection
85 Member
86 to 86b Face
88 to 88b Face
90 Circuit board
92 Land pattern
94 Solder
100 to 400 Coil component
500 Capacitor component
600 Electronic device

DETAILED DESCRIPTION OF EMBODIMENTS

Examples of the present invention are explained below by referring to the drawings.

Example 1

Figure 1B:
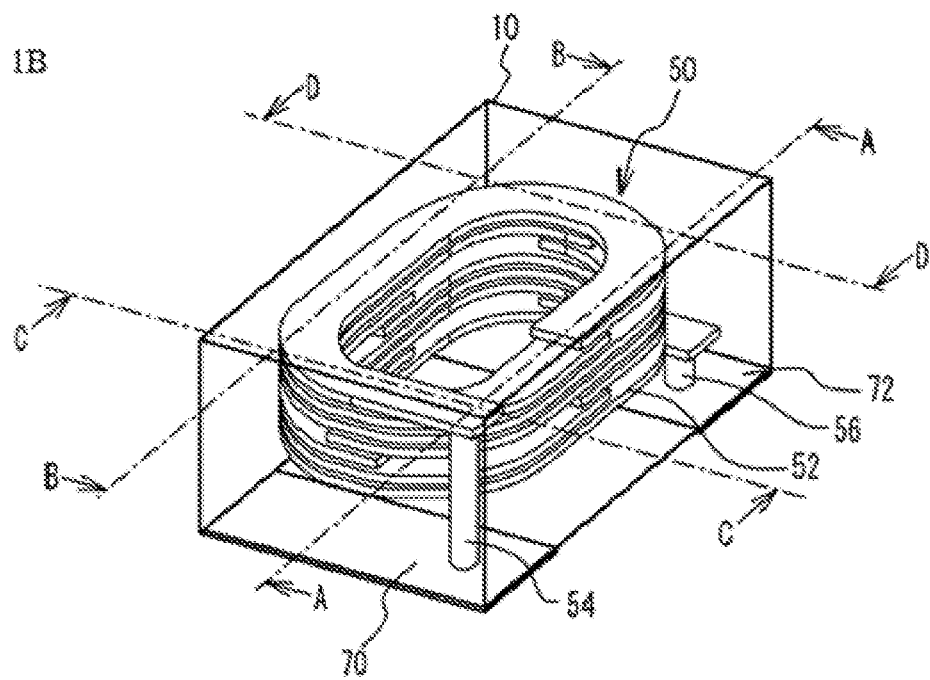
FIG. 1B is a transparent perspective view showing the interior, of the coil component pertaining to Example 1.
Figure 2A:
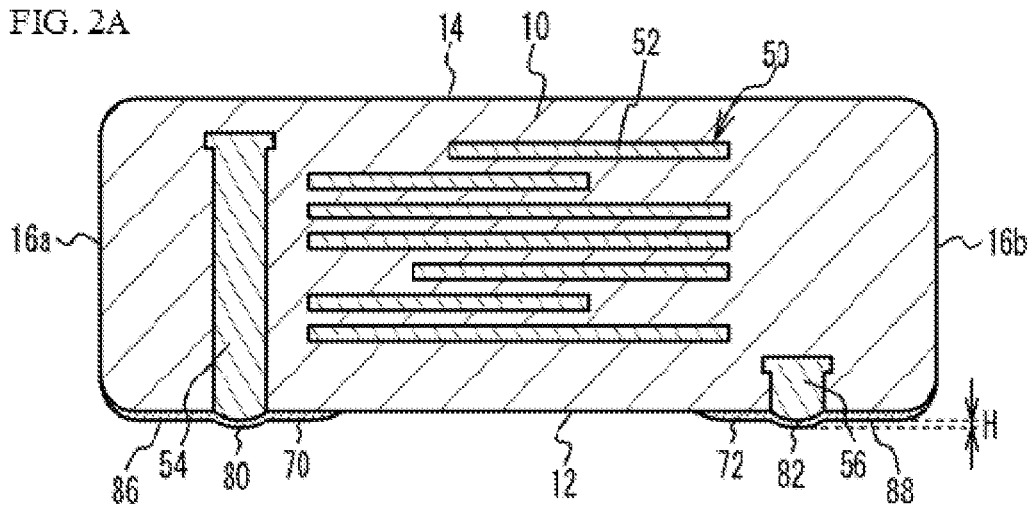
Figure 2B:
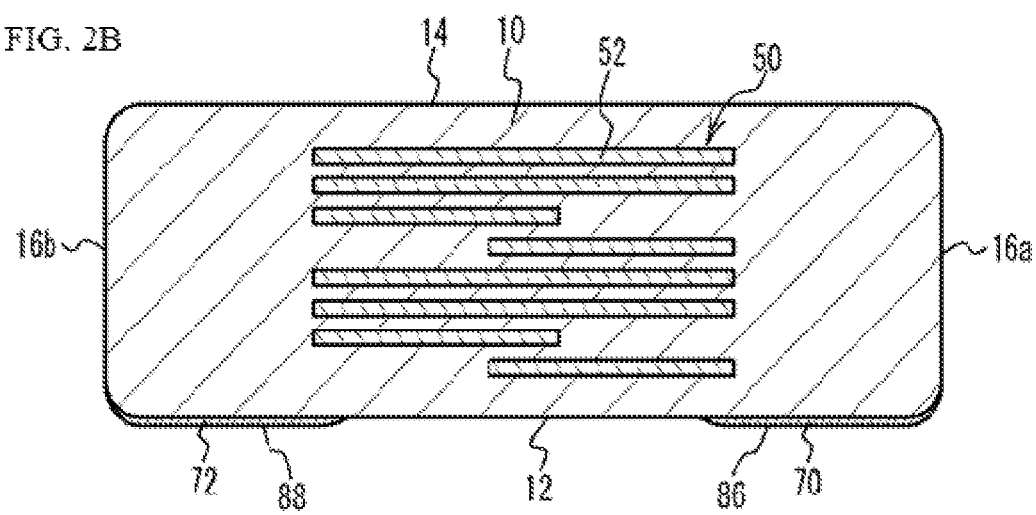
Figure 2C:
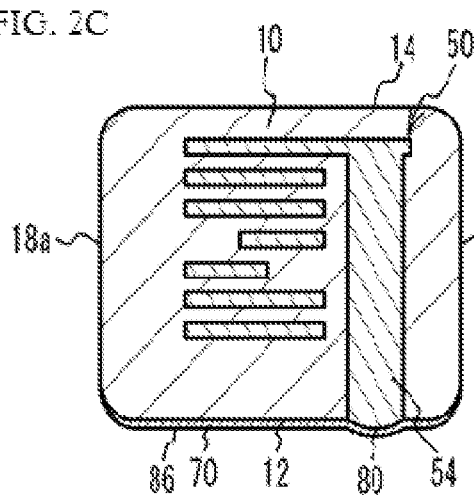
Figure 2D:
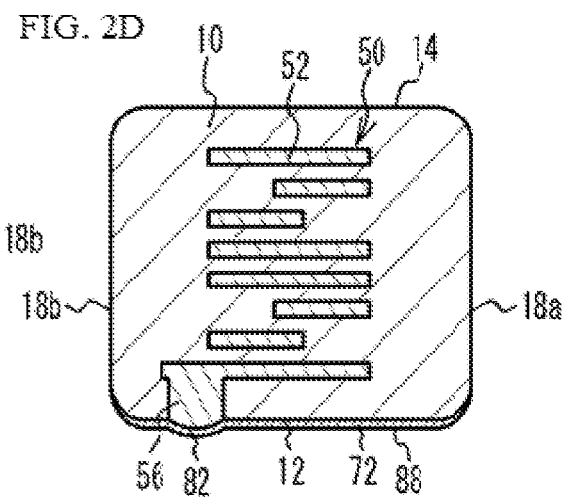

In Example 1, an example where the passive component is a coil component is explained. FIG. 1A is a perspective view, while FIG. 1B is a transparent perspective view showing the interior, of the coil component pertaining to Example 1. As shown in FIGS. 1A and 1B, the coil component 100 in Example 1 comprises a substrate body 10, an internal conductor 50 built into the substrate body 10, and external electrodes 70, 72 provided on the mounting surface, among all surfaces, of the substrate body 10.

FIGS. 2A to 2D are views of cross-section A-A to cross-section D-D in FIG. 1B, respectively. As shown in FIGS. 1A and 1B and in FIGS. 2A to 2D, the substrate body 10 is shaped as a rectangular solid having a bottom face 12, a top face 14, a pair of end faces 16a, 16b, and a pair of side faces 18a, 18b. The bottom face 12 is the mounting surface, while the top face 14 is the face on the opposite side of the bottom face 12. The pair of end faces 16a, 16b are the faces connected to the short sides of the bottom face 12 and top face 14, while the pair of side faces 18a, 18b are the faces connected to the long sides of the bottom face 12 and top face 14. It should be noted that the shape of the substrate body 10 is not limited to a perfect rectangular solid, and its apexes may be rounded, ridges (boundaries of faces) may be rounded, or faces may be curved, for example. In other words, "shaped as a rectangular solid" also includes these shapes.

The substrate body 10 has insulation property. The substrate body 10 may be formed by a magnetic material, or it may be formed by a non-magnetic material. The magnetic material may be a Ni—Zn-based, Mn—Zn-based, or other ferrite material, Fe—Si—Cr-based, Fe—Si—Al-based, Fe—Si—Cr—Al-based, or other soft magnetic alloy material, Fe, Ni, or other magnetic metal material, amorphous magnetic metal material, nanocrystal magnetic metal material, or resin containing metal magnetic grains, for example. The non-magnetic material may be silicon oxide ($SiO_2$), aluminum oxide ($Al_2O_3$), zirconium oxide ($ZrO_2$), titanium oxide ($TiO_2$), or other inorganic material, thermosetting resin or other resin material, borosilicate glass, or other glass material, or material prepared by mixing into a resin material a filler made of an inorganic material, for example.

The internal conductor 50 is formed by copper, aluminum, nickel, silver, platinum, palladium, or other metal material, or an alloy material containing the foregoing, for example. The internal conductor 50 includes a coil conductor 52 that forms a coil, and lead conductors 54, 56 led out from the coil conductor 52. The coil conductor 52 extends helically. The coil conductor 52 has a specified number of windings, as well as a coil axis crossing roughly at right angles with the plane defined by the windings. The top face 14 and bottom face 12 of the substrate body 10 are faces crossing (intersecting) roughly at right angles with the coil axis. The end faces 16*a*, 16*b* and side faces 18*a*, 18*b* of the substrate body 10 are faces roughly parallel with the coil axis. In this disclosure, the "coil conductor" refers to an electrical conductor used in electronic components, which is not only in the shape of a coil, spiral, or helix, but also includes a linear conductor, meandering conductor (e.g., zigzag-shaped conductor), and the like.

The lead conductor 54 is led out straight toward the bottom face 12 of the substrate body 10 from, of the pair of end parts of the coil conductor 52, the end part positioned on the top face 14 side of the substrate body 10. The lead conductor 56 is led out straight toward the bottom face 12 of the substrate body 10 from, of the pair of end parts of the coil conductor 52, the end part positioned on the bottom face 12 side of the substrate body 10. In other words, one end parts of the lead conductors 54, 56 are connected to the coil conductor 52. The other end parts of the lead conductors 54, 56 project from the bottom face 12 of the substrate body 10. The lead conductors 54, 56 project from the bottom face 12 of the substrate body 10 by approx. 5 μm to 20 μm, for example. Also, the diameters of the lead conductors 54, 56 are approx. 50 μm to 300 μm, for example.

Figure 3:
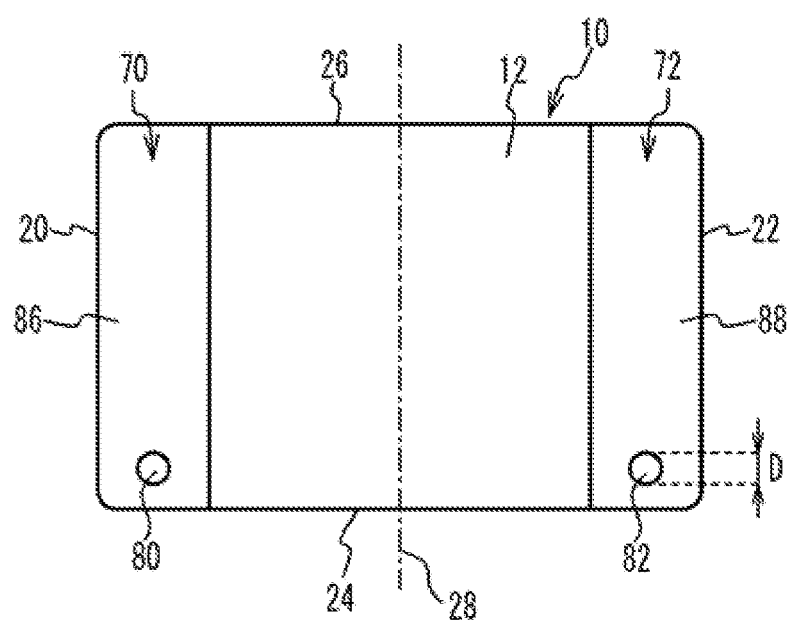
FIG. 3 is a plan view showing the bottom face, as viewed transparently from the top face side, of the coil component pertaining to Example 1.

FIG. 3 is a plan view showing the bottom face, as viewed transparently from the top face side, of the coil component pertaining to Example 1. It should be noted that, in FIG. 3, the internal conductor provided in the substrate body 10 is not shown for the purpose of illustrative clarity. As shown in FIGS. 1A and 1B, in FIGS. 2A to 2D, and in FIG. 3, the external electrodes 70, 72 serve as external terminals for surface mounting. The external electrode 70 is provided on the bottom face 12 of the substrate body 10 along the side 20 of the bottom face 12. The external electrode 72 is provided on the bottom face 12 of the substrate body 10 along the side 22 of the bottom face 12. The sides 20, 22 represent a pair of short sides that are facing each other. The external electrodes 70, 72 are provided only on the bottom face 12, among all surfaces, and not on the top face 14, end faces 16*a*, 16*b*, or side faces 18*a*, 18*b*, of the substrate body 10. In other words, the external electrodes 70, 72 are monohedral electrodes provided only on one face, among all surfaces, of the substrate body 10.

The external electrode 70 is connected to the lead conductor 54 led out toward the bottom face 12 of the substrate body 10, and projecting from the bottom face 12. The external electrode 72 is connected to the lead conductor 56 led out toward the bottom face 12 of the substrate body 10 and projecting from the bottom face 12. The external electrodes 70, 72 are formed by multiple metal layers, for example. The external electrodes 70, 72 have a multi-layer structure comprising a bottom layer formed by copper, aluminum, nickel, silver, platinum, palladium, or other metal material or an alloy material containing the foregoing, a middle layer formed by silver or a conductive resin containing silver, and a top layer being a nickel-and-tin plating layer, for example. It should be noted that the layer structure of the external electrodes 70, 72 is not limited to the one illustrated above, and there may be an intermediate layer between the respective layers, or a topmost layer may be provided on top of the top layer.

The external electrode 70 has a face 86 roughly parallel with the bottom face 12 of the substrate body 10, and a dome-shaped projection 80 that bulges, with reference to the roughly parallel face 86, away from the bottom face 12 of the substrate body 10. The external electrode 72 has a face 88 roughly parallel with the bottom face 12 of the substrate body 10, and a dome-shaped projection 82 that bulges, with reference to the roughly parallel face 88, away from the bottom face 12 of the substrate body 10. It should be noted that, here, the "roughly parallel face" may be a planar or flat principal face substantially parallel to the mounting surface and need not be parallel in the strict geometrical sense; instead, it may have a small inclination, error, etc., of a level of manufacturing error, some surface roughness, and other irregularity immaterial or insubstantial for mounting and affixing operation). The "roughly parallel face" may be referred to as "the planar principal face", "planar face", or "principal face". Also, the "dome-shaped projection" is a projection shaped in such a way that the projecting height is low on the outer periphery part of the projection and increases generally toward the center area of the projection (the center of the projection may preferably but need not be an apex or peak). The projection may be outwardly convex. The projection 80 of the external electrode 70 is formed, for example, at the position where the lead conductor 54 projects from the bottom face 12 of the substrate body 10. For example, the projection 80 is formed as a result of the lead conductor 54 projecting from the bottom face 12 of the substrate body 10. Similarly, the projection 82 of the external electrode 72 is formed, for example, at the position where the lead conductor 56 projects from the bottom face 12 of the substrate body 10. For example, the projection 82 is formed as a result of the lead conductor 56 projecting from the bottom face 12 of the substrate body 10.

The projections 80, 82 are provided at positions symmetrical to each other across the center line 28 passing through the respective centers of the pair of long sides 24, 26 of the bottom face 12 of the substrate body 10, for example. The heights H of the projections 80, 82 from the planar faces (roughly parallel faces) 86, 88 are 5 μm to 20 μm, for example, and 10 μm (±20%) in one example. The diameters D of the projections 80, 82 on the planar faces 86, 88 are 50 μm to 300 μm, for example, and 150 μm (±20%) in one example.

Now, how the coil component 100 in Example 1 is manufactured is explained. The coil component 100 is formed through steps that include those for stacking multiple green sheets (insulation sheets) together. Green sheets are insulation precursors that will constitute a substrate body 10, etc., and formed by, for example, applying a slurry made of insulation material in shapes of films using the doctor's blade method, etc.

First, multiple green sheets are prepared. Some of the multiple green sheets are laser-cut to make through holes at specified positions. Next, a conductive material is applied on the green sheets in which through holes have been formed, using the printing method, for example, to form precursors to a coil conductor 52 and lead conductors 54, 56. When sintered, they will become a coil conductor 52 and lead conductors 54, 56.

Next, the multiple green sheets are stacked in a specified order and then pressed in the stacking direction, to pressure-bond the multiple green sheets. Thereafter, a dicer, hand-held cutter, etc., is used to cut the pressure-bonded green sheets into individual chips that are then sintered at a specified temperature. Here, by using, for the conductive material by which to form a coil conductor 52 and lead conductors 54, 56, a material that shrinks less, when sintered, than the insulating material by which to form a substrate body 10, a structure characterized by the end parts of the lead conductors 54, 56 projecting from the bottom face 12 of the substrate body 10 can be obtained. As a result of this sintering, a substrate body 10 in which a coil conductor 52 and lead conductors 54, 56 are provided, is formed.

Next, external electrodes 70, 72 are formed on the bottom face 12 of the substrate body 10. The external electrodes 70, 72 are formed by paste printing, plating, sputtering, or other method used in thin-film processes. Because the end parts of the lead conductors 54, 56 are projecting on the bottom face 12 of the substrate body 10, a projection 80 is formed on the external electrode 70, while a projection 82 is formed on the external electrode 72.

Next, the coil component in a comparative example is explained. The coil component in the comparative example is different from the coil component 100 in Example 1 in that the end parts of the lead conductors do not project from the bottom face of the substrate body and no projections are formed on the external electrodes. According to the comparative example, the coil component, as it is mounted onto a circuit board by joining the external electrodes of the coil component to the solder applied to the land patterns on the circuit board, may shift out of its specified position and be mounted as such. For example, insufficient pressure may be applied when the external electrodes of the coil component are pressed against the solder on the circuit board, in which case the external electrodes may partially become suspended in air without touching the solder. When this happens, the coil component, which has been pressed against the solder using a pickup device, for example, may shift out of its specified position due to vibrations that apply to the coil component as the pickup device is raised and the vacuum is broken. During the course of melting and hardening the solder, for example, vibrations that generate when the circuit board is transported to the melting furnace may cause the coil component to shift out of its specified position. On the other hand, applying too much pressure when pressing the external electrodes of the coil component against the solder on the circuit board may cause the solder to unevenly ooze out of the electrodes on the circuit board. In this case, the coil component may shift out of its specified position as a result of reflow soldering. The trend for smaller coil components is reducing the size of land patterns on circuit boards and the amounts of solder supplied to the land patterns, and this is making it difficult to adjust the pressure with which to press the coil components against the solder.

According to Example 1, on the other hand, the external electrode 70 has a face 86 roughly parallel with the bottom face 12 of the substrate body 10, and a dome-shaped projection 80 that bulges, with reference to the planar face 86, away from the bottom face 12 of the substrate body 10 as shown in FIGS. 2A to 2D. The external electrode 72 has a face 88 roughly parallel with the bottom face 12 of the substrate body 10, and a dome-shaped projection 82 that bulges, with reference to the planar face 88, away from the bottom face 12 of the substrate body 10. This way, pressing the external electrodes 70, 72 against the solder applied on the circuit board causes the projections 80, 82 to bite into the solder. This prevents the coil component 100 from shifting out of its specified position even when vibrations, which generate as the pickup device is raised and the vacuum is broken or as the circuit board is transported to the melting furnace, apply to the coil component 100. Also, the projection 80 ensures some spacing between the areas of the external electrode 70 other than the projection 80, and the solder, while the projection 82 ensures some spacing between the areas of the external electrode 72 other than the projection 82, and the solder, and consequently the amount of solder oozing out of the land pattern on the circuit board can be reduced. This prevents the coil component 100 from shifting out of its specified position as a result of reflow soldering. Also, air bubbles may remain between the external electrodes 70, 72 and the solder, in which case the coil component 100 may shift out of its specified position as the coil component 100 is heated to high temperature during reflow soldering, etc., and the air bubbles break. However, the projection 80 is formed on the external electrode 70, while the projection 82 is formed on the external electrode 72, and this prevents air bubbles from remaining between the external electrodes 70, 72 and the solder when the external electrodes 70, 72 are pressed against the solder on the circuit board, which consequently prevents the coil component 100 from shifting out of its specified position. As explained above, misalignment problems of the coil component 100 can be prevented, according to Example 1.

From the viewpoint of causing the projections 80, 82 to bite into the solder and thereby preventing misalignment problems, the heights H of the projections 80, 82 from the planar faces 86, 88 are preferably 5 µm or greater, or more preferably 8 µm or greater, or even more preferably 12 µm or greater. The diameters D of the projections 80, 82 on the planar faces 86, 88 are preferably 50 µm or greater, or more preferably 120 µm or greater, or even more preferably 190 µm or greater. On the other hand, greater heights H from the planar faces 86, 88 or diameters D of the projections 80, 82 on the planar faces 86, 88, mean the amounts of solder oozing out of the land patterns on the circuit board will increase. Accordingly, the heights H of the projections 80, 82 from the planar faces 86, 88 are preferably 20 µm or smaller, or more preferably 17 µm or smaller, or even more preferably 14 µm or smaller. The diameters D of the projections 80, 82 on the planar faces 86, 88 are preferably 300 µm or smaller, or more preferably 260 µm or smaller, or even more preferably 220 µm or smaller. Keeping them in these ranges also allows for stable forming of the projections 80, 82 using a relatively easy method.

As shown in FIGS. 2A to 2D and in FIG. 3, preferably the projections 80, 82 are spherical bulges having no flat area at their apexes. This way, the projections 80, 82 bite into the solder more easily when the external electrodes 70, 72 are pressed against the solder applied to the circuit board, compared to when there are flat areas at the apexes of the projections 80, 82. It should be noted that, while FIG. 3 shows an example where the projections 80, 82 have a circular shape on the side of the roughly flat faces 86, 88, they may have an oval shape or other shape. The overall shape of the projections 80, 82 may be a sphere bulging outward, a circular cone or circular truncated cone, triangular pyramid or quadrangular pyramid, or the like, for example. These shapes are characterized in that they have only a small flat area, if any, at the apex, or no flat area at the apex, and are also symmetrical across the apex. This way, pressing the external electrodes 70, 72 against the solder on the circuit board causes the solder to ooze out evenly and also allows the projections 80, 82 to bite into the solder.

As shown in FIGS. 2A to 2D and in FIG. 3, preferably multiple external electrodes 70, 72 are provided, having the projection 80 on the planar face 86 and the projection 82 on the planar face 88, respectively. This way, the number of projections that bite into the solder on the circuit board as the coil component 100 is mounted onto the circuit board, can be increased. As a result, misalignment problems of the coil component 100 at mounting can be prevented in an effective manner.

As shown in FIG. 3, preferably the projection 80 on the external electrode 70, and the projection 82 on the external electrode 72, are provided at positions symmetrical to each other across the center line 28 passing through the respective centers of the pair of long sides 24, 26 of the bottom face 12 of the substrate body 10. This prevents any irregular tilting of the coil component 100 that may otherwise occur when the external electrodes 70, 72 are pressed against the solder applied to the circuit board. As a result, the coil component 100 is prevented from shifting out of its specified position during reflow soldering, for example.

As shown in FIG. 3, preferably the external electrode 70 has the projection 80 at a position away from the sides 20, 22, 24, and 26 constituting the bottom face 12 of the substrate body 10, while the external electrode 72 has the projection 82 at a position away from the sides 20, 22, 24, and 26. This reduces the amounts of solder squeezed out, by the projections 80, 82, of the land patterns on the circuit board when the external electrodes 70, 72 are pressed against the solder on the circuit board. As a result, the coil component 100 is prevented, in an effective manner, from shifting out of its specified position during reflow soldering. Also, because the amounts of solder oozing out of the land patterns on the circuit board are reduced, high-density mounting of coil components 100 becomes possible. From the viewpoint of reducing the amounts of solder oozing out of the land patterns on the circuit board, preferably the projection 80 is provided in the center area, including the center, of the external electrode 70, while the projection 82 is provided in the center area, including the center, of the external electrode 72.

Also, preferably the external electrodes 70, 72 are formed by materials that contain nickel (Ni). Due to its high hardness, Ni improves the strength of the projections 80, 82, which in turn prevents the projections 80, 82 from deforming.

As shown in FIGS. 2A to 2D, preferably the internal conductor 50 has the coil conductor 52 that forms a coil, and the lead conductors 54, 56 which are led out from the coil conductor 52 and whose end parts project from the bottom face 12 of the substrate body 10. And, preferably the projections 80, 82 are formed as a result of the external electrodes 70, 72 covering the end parts of the lead conductors 54, 56. This way, the contact area between the external electrode 70 and the lead conductor 54, and the contact area between the external electrode 72 and the lead conductor 56, can be increased. As a result, good electrical connection can be achieved between the external electrode 70 and the lead conductor 54, and also between the external electrode 72 and the lead conductor 56. Also, when the external electrodes 70, 72 are joined to the solder applied to the land patterns on the circuit board, the spacings between the external electrodes 70, 72 and the land patterns become shorter by the heights of the projections 80, 82. As a result, the electrical resistances between the lead conductors 54, 56 and the land patterns on the circuit board can be reduced. Because the electrical resistances are reduced, the amount of heat generated by application of large current can be reduced.

As shown in FIG. 3, the area S of the projection 80 on the planar face 86 side ($S=\pi \times (D/2)^2$) is preferably equal to or smaller than one-ninth, or more preferably equal to or smaller than one-twelfth, or even more preferably equal to or smaller than one-fifteenth, the area of the external electrode 70 on the bottom face 12 of the substrate body 10. Similarly, the area S of the projection 82 on the planar face 88 side ($S=\pi \times (D/2)^2$) is preferably equal to or smaller than one-ninth, or more preferably equal to or smaller than one-twelfth, or even more preferably equal to or smaller than one-fifteenth, the area of the external electrode 72 on the bottom face 12 of the substrate body 10. This reduces the amounts of solder squeezed out by the projections 80, 82 when the external electrodes 70, 72 are pressed against the solder on the circuit board, which in turn reduces the amounts of solder oozing out of the land patterns on the circuit board. As a result, high-density mounting of coil components 100 becomes possible. From the viewpoint of causing the projections 80, 82 to bite into the solder and thereby preventing the misalignment of the coil component 100, on the other hand, the area S of the projection 80 on the planar face 86 side is preferably equal to or greater than one-twenty-fifth, or more preferably equal to or greater than one-twentieth, or even more preferably equal to or greater than one-eighteenth, the area of the external electrode 70 on the bottom face 12 of the substrate body 10. Similarly, the area S of the projection 82 on the planar face 88 side is preferably equal to or greater than one-twenty-fifth, or more preferably equal to or greater than one-twentieth, or even more preferably equal to or greater than one-eighteenth, the area of the external electrode 72 on the bottom face 12 of the substrate body 10.

It should be noted that, the smaller and lighter the coil component 100, the more likely the coil component 100 becomes misaligned as it is mounted onto a circuit board. When the size of the coil component 100 is expressed by "Length×Width×Height," for example, preferably the projections 80, 82 are provided when ratio of the height to the width (Height/Width) is 0.5 or smaller, or more preferably the projections 80, 82 are provided when the ratio is 0.3 or smaller. Also, preferably the projections 80, 82 are provided when the height of the coil component 100 is 0.5 mm or smaller, or more preferably the projections 80, 82 are provided when the height is 0.3 mm or smaller. It should be noted that examples of coil component 100 sizes (Length× Width×Height) that make providing the projections 80, 82 preferable include 0.2 mm×0.1 mm×0.1 mm, 0.3 mm×0.2 mm×0.1 mm, 0.3 mm×0.2 mm×0.2 mm, 0.4 mm×0.2 mm×0.2 mm, 0.6 mm×0.3 mm×0.3 mm, 1.0 mm×0.5 mm×0.3 mm, 1.6 mm×0.8 mm×0.3 mm, 1.6 mm×0.8 mm×0.4 mm, 1.6 mm×0.8 mm×0.5 mm, 1.6 mm×1.0 mm×0.3 mm, 1.6 mm×1.0 mm×0.4 mm, 1.6 mm×1.0 mm×0.5 mm, 1.6 mm×1.2 mm×0.3 mm, 1.6 mm×1.2 mm×0.4 mm, 1.6 mm×1.2 mm×0.5 mm, 2.0 mm×1.2 mm×0.3 mm, 2.0 mm×1.2 mm×0.4 mm, 2.0 mm×1.2 mm×0.5 mm, 2.0 mm×1.2 mm×0.6 mm, 2.0 mm×1.6 mm×0.3 mm, 2.0 mm×1.6 mm×0.5 mm, 2.0 mm×1.6 mm×0.6 mm, and 2.0 mm×1.6 mm×0.8 mm, and the like.

It should be noted that the external electrodes 70, 72 may be formed in a manner extending from the bottom face 12 of the substrate body 10 onto parts of the end faces 16a, 16b on the bottom face 12 side. For example, the external electrodes 70, 72 may be formed in a manner extending from the bottom face 12 of the substrate body 10 onto the end faces 16a, 16b by roughly the thickness of the solder applied to the land patterns on the circuit board. For example, the external electrodes 70, 72 may be formed in a manner extending from the bottom face 12 of the substrate body 10 onto the end faces 16a, 16b by a height equal to or smaller than 50 µm toward the top face 14 with reference to the bottom face 12. Since land patterns are not formed on the end face sides of the circuit board, solder fillets do not generate in these areas when the circuit board is mounted, and the end faces 16a, 16b are wet by the solder. This improves the joining strength of the coil component 100 after it has been mounted onto the circuit board, without increasing its footprint. The sides and corners of the respective faces of the substrate body 10 may be tapered, rounded, etc., and the external electrodes may be formed in a manner extending from areas of these sides and corners of the bottom face 12.

Figure 4A:
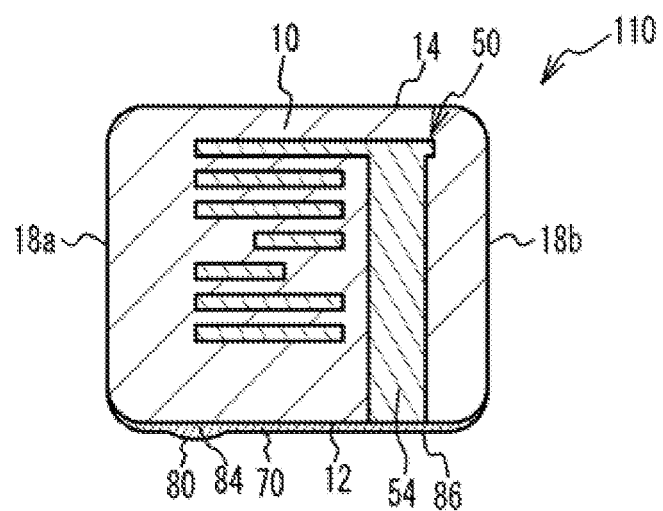
Figure 4B:
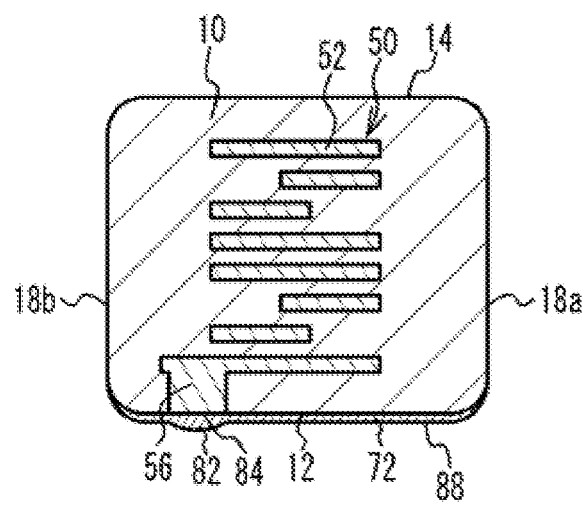
Figure 4C:
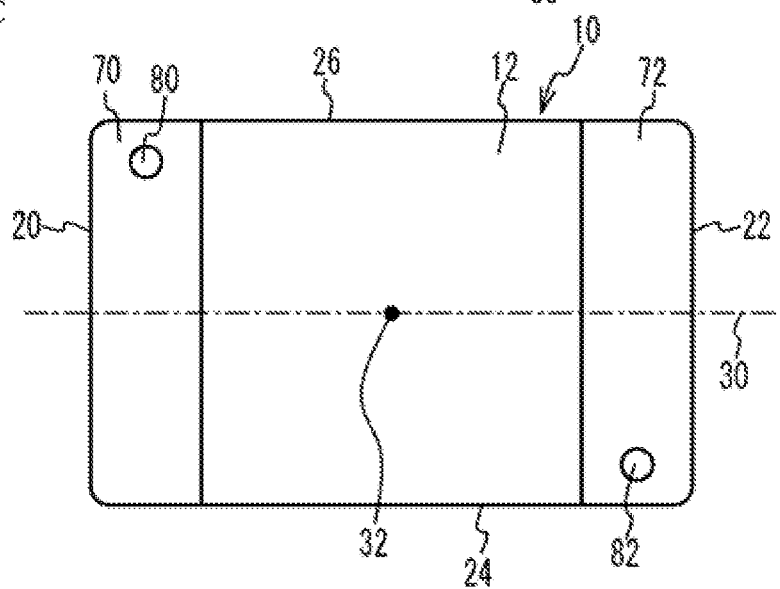
FIG. 4C is a plan view showing the bottom face, as viewed transparently from the top face side, of the coil component pertaining to Variation Example 1 of Example 1.

FIGS. 4A and 4B are cross-sectional views, while FIG. 4C is a plan view showing the bottom face, as viewed transparently from the top face side, of the coil component pertaining to Variation Example 1 of Example 1. It should be noted that, in FIG. 4C, the internal conductor provided in the substrate body 10 is not shown for the purpose of illustrative clarity. As shown in FIGS. 4A to 4C, the coil component 110 in Variation Example 1 of Example 1 is such that its lead conductors 54, 56 do not project from the bottom face 12 of the substrate body 10. The external electrode 70 has the projection 80 in an area on the opposite side, across the center line 30 passing through the respective centers of the pair of short sides 20, 22 that constitute the bottom face 12 of the substrate body 10, of the area to which the lead conductor 54 is led out on the bottom face 12 of the substrate body 10. The external electrode 72 has the projection 82 in an area to which the lead conductor 56 is led out on the bottom face 12 of the substrate body 10. The projections 80, 82 are formed as a result of parts of the external electrodes 70, 72 becoming thicker, in shapes of domes, than the thicknesses of the faces 86, 88 that are roughly parallel with the bottom face 12 of the substrate body 10. The projections 80, 82 are provided at positions rotationally symmetrical to each other with respect to the center 32 of the bottom face 12 of the substrate body 10. The other constitutions are the same as those in Example 1 and therefore not explained. It should be noted that the projections 80 and 82, which are formed as a result of parts of the external electrodes 70, 72 becoming thicker, in shapes of domes, than the thicknesses of the faces 86, 88 that are roughly parallel with the bottom face 12 of the substrate body 10, may be formed by, for example, using a paste made of the same material as that of the external electrodes 70, 72 to form inner areas 84 of projections before the external electrodes 70, 72 are formed, and then forming the external electrodes 70, 72 in a manner covering the inner areas 84 of projections. Although the inner areas 84 of projections may be hardened independently, hardening them at the same time as the external electrodes 70, 72 reduces production steps.

Example 1 shows an example where the end parts of the lead conductors 54, 56 projecting from the bottom face 12 of the substrate body 10 are covered by the external electrodes 70, 72 to form the projections 80, 82; however, the present invention is not limited to the foregoing. Just like in Variation Example 1 of Example 1, the lead conductors 54, 56 may not project from the bottom face 12 of the substrate body 10, and the projections 80, 82 may bulge in shapes of domes, as a result of parts of the external electrodes 70, 72 becoming thicker. In this case, too, the projections 80, 82 bite into the solder when the external electrodes 70, 72 are pressed against the solder on the circuit board, which prevents misalignment problems of the coil component 110 at mounting.

As shown in FIG. 4C, preferably the projection 80 of the external electrode 70, and the projection 82 of the external electrode 72, are provided at positions rotationally symmetrical to each other with respect to the center 32 of the bottom face 12 of the substrate body 10. This prevents any irregular tilting of the coil component 110 that may otherwise occur when the external electrodes 70, 72 are pressed against the solder applied to the circuit board. As a result, the coil component 110 is prevented from shifting out of its specified position during reflow soldering, for example.

Figure 5A:
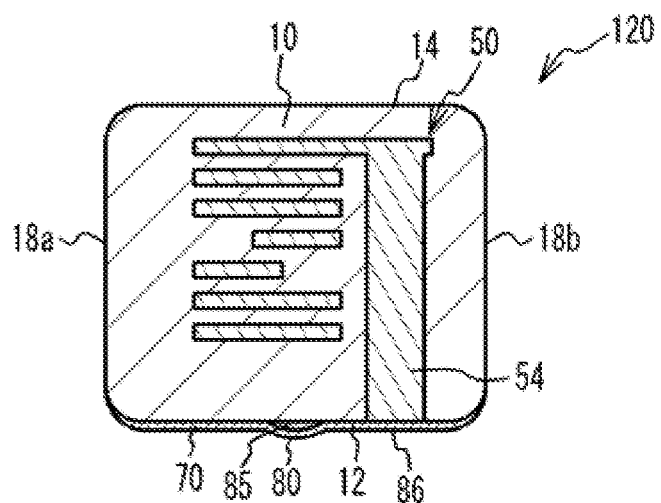
Figure 5B:
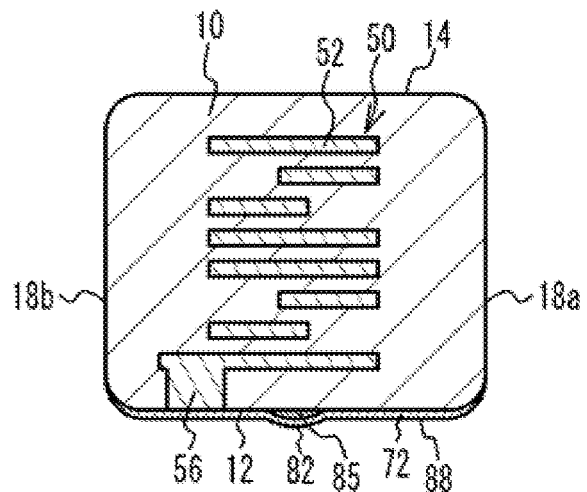
Figure 5C:
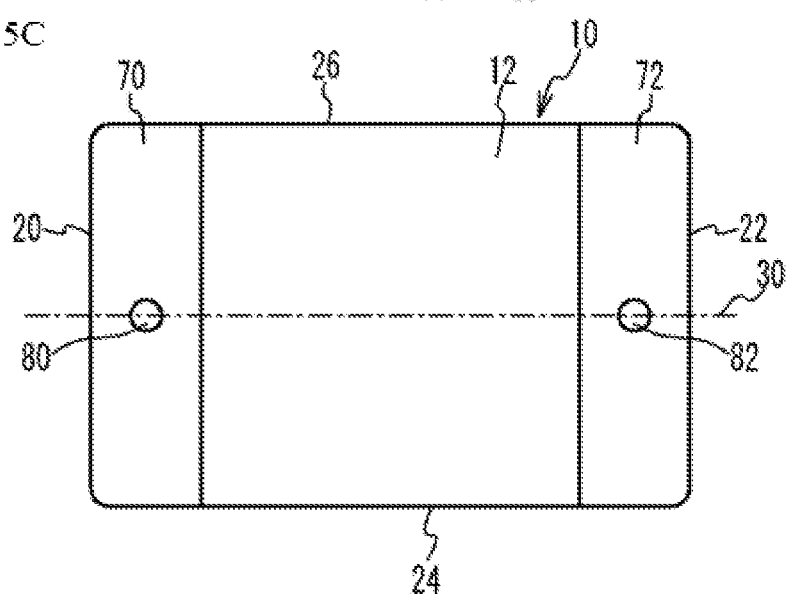
FIG. 5C is a plan view showing the bottom face, as viewed transparently from the top face side, of the coil component pertaining to Variation Example 2 of Example 1.

FIGS. 5A and 5B are cross-sectional views, while FIG. 5C is a plan view showing the bottom face, as viewed transparently from the top face side, of the coil component pertaining to Variation Example 2 of Example 1. It should be noted that, in FIG. 5C, the internal conductor provided in the substrate body 10 is not shown for the purpose of illustrative clarity. As shown in FIGS. 5A to 5C, the coil component 120 in Variation Example 2 of Example 1 is such that its lead conductors 54, 56 do not project from the bottom face 12 of the substrate body 10. The external electrodes 70, 72 have their projections 80, 82 at positions different from the positions to which the lead conductors 54, 56 are led out on the bottom face 12 of the substrate body 10, along the center line 30 passing through the respective centers of the pair of short sides 20, 22 that constitute the bottom face 12 of the substrate body 10. The projections 80, 82 are formed by members 85, which are made of a material different from that of the external electrodes 70, 72, provided on the bottom face 12 of the substrate body 10. The material of the members 85 may be the same as or different from that of the substrate body 10. The other constitutions are the same as those in Example 1 and therefore not explained. It should be noted that the projections 80 and 82, which have the members 85 inside that are made of a material different from that of the external electrodes 70, 72, may be formed by, for example, forming the members 85 using a resin, glass, or other paste before the external electrodes 70, 72 are formed, and then forming the external electrodes 70, 72 in a manner covering the members 85. The members 85 are obtained when the resin or glass portion of the resin, glass, or other paste that has been printed, coated, or otherwise applied, etc., is hardened at a temperature appropriate for the material. This hardening of the resin or glass portion may be performed at the same time the substrate body 10 is sintered if it is sintered, or at the same time the substrate body 10 is hardened or otherwise heat-treated if it is hardened or otherwise heat-treated, or at the same time the external electrodes 70, 72 are baked if they are baked, or at the same time the external electrodes 70, 72 are hardened or otherwise heat-treated if they are hardened or otherwise heat-treated; however, the hardening may also be performed independently.

As shown in Variation Example 2 of Example 1, the lead conductors 54 and 56 may not project from the bottom face 12 of the substrate body 10, and the insides of the projections 80, 82 may be the members 85 made of a material different from that of the external electrodes 70, 72. In this case, too, the projections 80, 82 bite into the solder when the external electrodes 70, 72 are pressed against the solder on the circuit board, which prevents misalignment problems of the coil component 120 at mounting.

FIGS. 6A to 6C are plan views showing the bottom faces, as viewed transparently from the top face sides, of the coil components pertaining to Variation Example 3 to Variation Example 5 of Example 1. It should be noted that, in FIGS. 6A to 6C, the internal conductor provided in the substrate body 10 is not shown for the purpose of illustrative clarity. As illustrated by the coil component 130 pertaining to Variation Example 3 of Example 1 in FIG. 6A, the external electrode 70 may have projections 80 at two locations, including the area where the lead conductor 54 projects from the bottom face 12 of the substrate body 10, and an area adjacent to this area. The external electrode 72 may have projections 82 at two locations, including the area where the lead conductor 56 projects from the bottom face 12 of the substrate body 10, and an area adjacent to this area. As illustrated by the coil component 140 pertaining to Variation Example 4 of Example 1 in FIG. 6B, the external electrode 70 may have projections 80 at two locations, including the area where the lead conductor 54 projects from the bottom face 12 of the substrate body 10, and an area positioned on the opposite side of this area across the center line 30 passing through the respective centers of the pair of short sides 20, 22 that constitute the bottom face 12 of the substrate body 10. The external electrode 72 may have projections 82 at two locations, including the area where the lead conductor 56 projects from the bottom face 12 of the substrate body 10, and an area positioned on the opposite side of this area across the center line 30 passing through the respective centers of the pair of short sides 20, 22 that constitute the bottom face 12 of the substrate body 10. When multiple projections 80 are provided on the external electrode 70, and multiple projections 82 are provided on the external electrode 72, as shown in Variation Example 3 of Example 1 and Variation Example 4 of Example 1, the number of projections that bite into the solder on the circuit board as the coil component is mounted onto the circuit board, can be increased. As a result, misalignment problems of the coil component at mounting can be prevented in an effective manner. Also, an increase in the number of projections that bite into the solder means the external electrodes 70, 72 contact the solder over larger areas, and this can improve the joining strength of the external electrodes 70, 72 and the solder.

As illustrated by the coil component 150 pertaining to Variation Example 5 of Example 1 in FIG. 6C, the external electrodes 70, 72 may have projections 80, 82 whose bottom dimensions include, and are greater than, the areas where the lead conductors 54, 56 project from the bottom face 12 of the substrate body 10, respectively. In this case, the volumes of the projections that bite into the solder on the circuit board as the coil component is mounted onto the circuit board, can be increased, and therefore misalignment problems of the coil component at mounting can be prevented in an effective manner.

Example 2

Figure 7A:
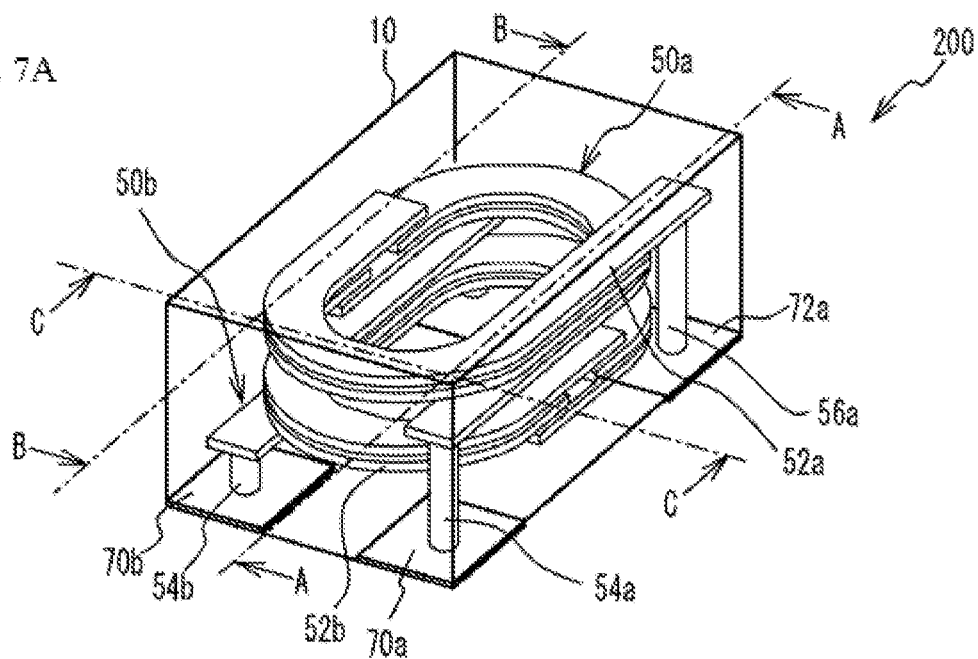
FIG. 7A is a transparent perspective view.
Figure 7B:
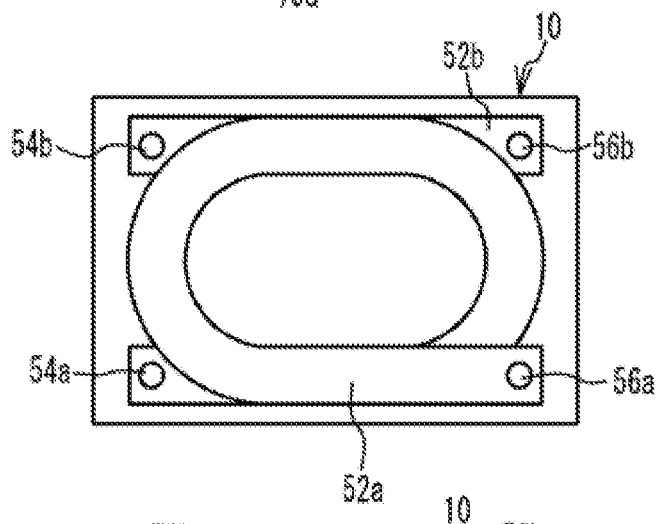
Figure 7C:
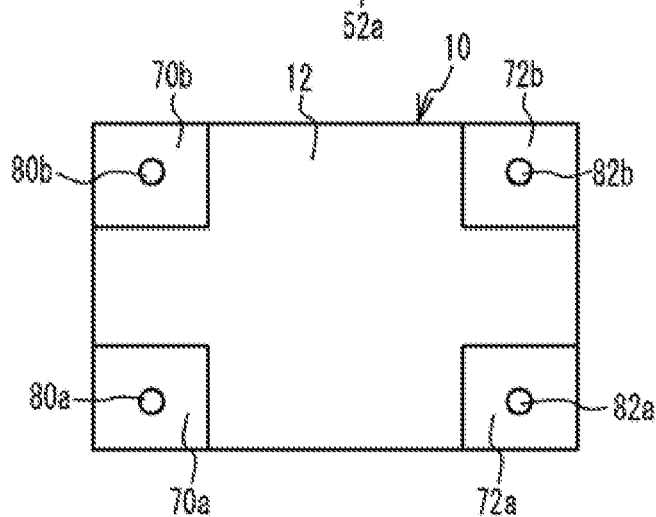
FIG. 7C is a plan view showing the bottom face, as viewed transparently from the top face side, of the coil component pertaining to Example 2.
Figure 8A:
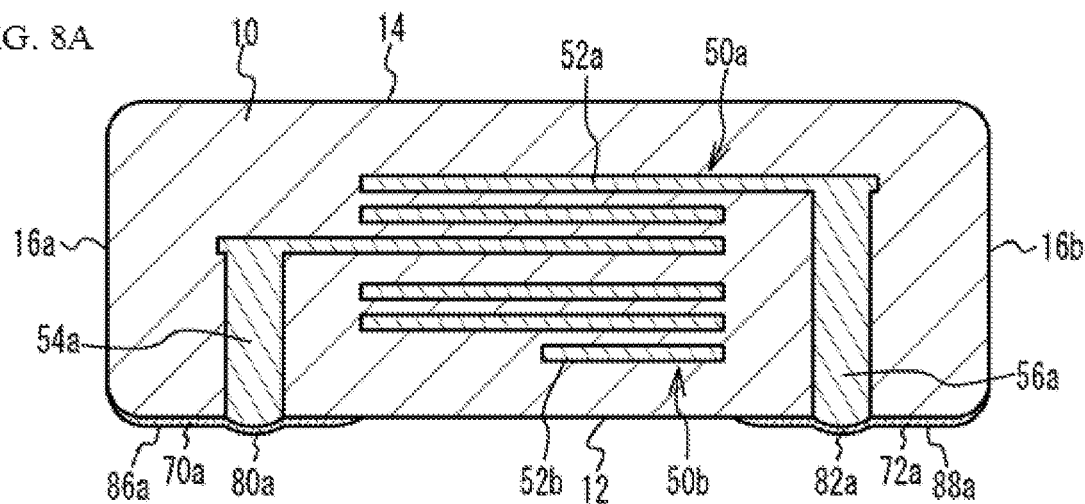
FIGS. 8A to 8C are views of cross-section A-A to cross-section C-C in FIG. 7A, respectively.
Figure 8B:
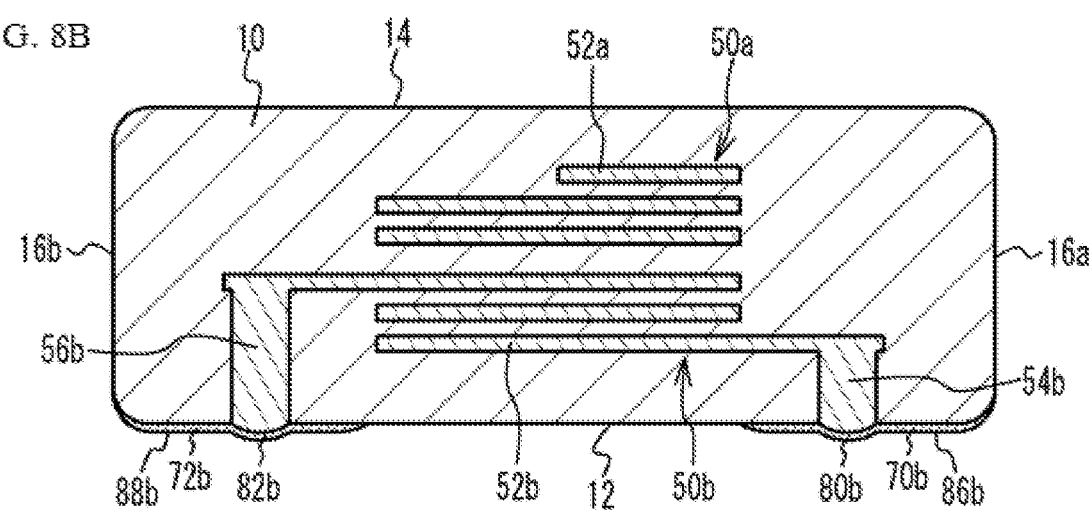
Figure 8C:
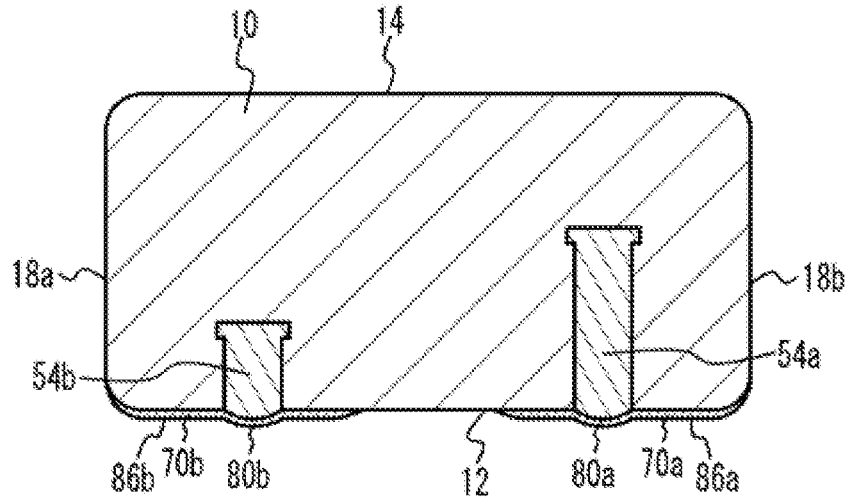

FIG. 7A is a transparent perspective view, FIG. 7B is a top transparent view, while FIG. 7C is a plan view showing the bottom face, as viewed transparently from the top face side, of the coil component pertaining to Example 2. It should be noted that, in FIG. 7C, the internal conductor provided in the substrate body 10 is not shown for the purpose of illustrative clarity. FIGS. 8A to 8C are views of cross-section A-A to cross-section C-C in FIG. 7A, respectively. As shown in FIGS. 7A to 7C, and in FIGS. 8A to 8C, the coil component 200 in Example 2 has two electrically-isolated internal conductors 50a, 50b built into the substrate body 10. The internal conductor 50a includes a coil conductor 52a that forms a coil, and lead conductors 54a, 56a led out from the two end parts of the coil conductor 52a. The coil conductor 52a extends helically. The lead conductors 54a, 56a are led out straight toward the bottom face 12 of the substrate body 10 from the two end parts of the coil conductor 52a, and these two end parts project from the bottom face 12 of the substrate body 10. Similarly, the internal conductor 50b includes a coil conductor 52b that forms a coil, and lead conductors 54b, 56b led out from the two end parts of the coil conductor 52b. The coil conductor 52b extends helically. The lead conductors 54b, 56b are led out straight toward the bottom face 12 of the substrate body 10 from the two end parts of the coil conductor 52b, and these two end parts project from the bottom face 12 of the substrate body 10.

Provided on the bottom face 12 of the substrate body 10 are four external electrodes 70a, 72a, 70b, 72b that serve as external terminals for surface mounting. The four external electrodes 70a, 72a, 70b, 72b are provided near the four corners of the bottom face 12 of the substrate body 10, and not on the top face 14, end faces 16a, 16b, or side faces 18a, 18b. The external electrode 70a is connected to the lead conductor 54a led out toward the bottom face 12 of the substrate body 10 and projecting from the bottom face 12, and has a dome-shaped projection 80a formed as a result of the lead conductor 54a projecting from the bottom face 12 of the substrate body 10. The external electrode 72a is connected to the lead conductor 56a led out toward the bottom face 12 of the substrate body 10 and projecting from the bottom face 12, and has a dome-shaped projection 82a formed as a result of the lead conductor 56a projecting from the bottom face 12 of the substrate body 10. Similarly, the external electrode 70b is connected to the lead conductor 54b led out toward the bottom face 12 of the substrate body 10 and projecting from the bottom face 12, and has a dome-shaped projection 80b formed as a result of the lead conductor 54b projecting from the bottom face 12 of the substrate body 10. The external electrode 72b is connected to the lead conductor 56b led out toward the bottom face 12 of the substrate body 10 and projecting from the bottom face 12, and has a dome-shaped projection 82b formed as a result of the lead conductor 56b projecting from the bottom face 12 of the substrate body 10. The other constitutions are the same as those in Example 1 and therefore not explained.

Figure 9:
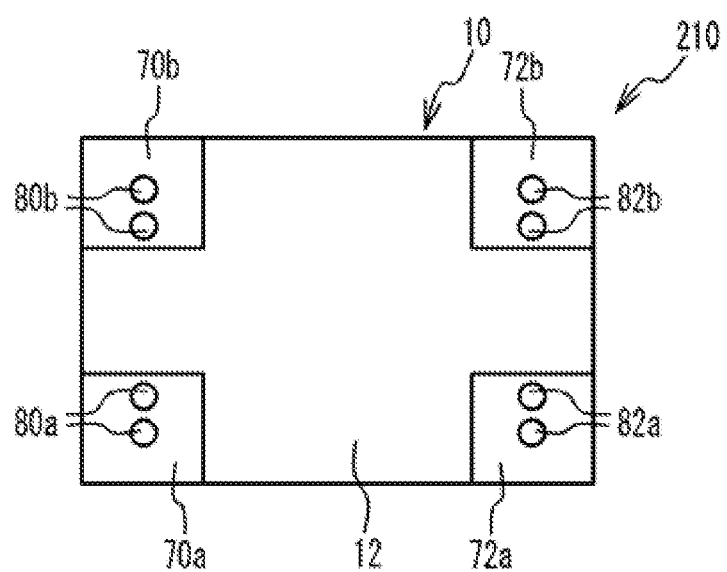
FIG. 9 is a plan view showing the bottom face, as viewed transparently from the top face side, of the coil component pertaining to Variation Example 1 of Example 2.

According to Example 2, the internal conductors 50a, 50b including the electrically isolated coil conductors 52a, 52b are built into the substrate body 10. The lead conductors 54a, 56a led out from the two end parts of the coil conductor 52a are connected to the external electrodes 70a, 72a provided on the bottom face 12 of the substrate body 10. The lead conductors 54b, 56b led out from the two end parts of the coil conductor 52b are connected to the external electrodes 70b, 72b provided on the bottom face 12 of the substrate body 10. The external electrodes 70a, 72a, 70b, 72b have faces 86a, 88a, 86b, 88b that are roughly parallel with the bottom face 12 of the substrate body 10, as well as dome-shaped projections 80a, 82a, 80b, 82b that bulge, with reference to the bottom face 12 of the substrate body 10, away from the planar faces 86a, 88a, 86b, 88b. This way, the projections 80a, 82a, 80b, 82b provided on the external electrodes 70a, 72a, 70b, 72b bite into the solder as the coil component 200 is mounted onto the circuit board. This increases the number of projections that bite into the solder, compared to Example 1, and therefore misalignment of the coil component 200 at mounting can be prevented in an effective manner FIG. 9 is a plan view showing the bottom face, as viewed transparently from the top face side, of the coil component pertaining to Variation Example 1 of Example 2. It should be noted that, in FIG. 9, the internal conductor provided in the substrate body 10 is not shown for the purpose of illustrative clarity. As illustrated by the coil component 210 in Variation Example 1 of Example 2 in FIG. 9, the external electrode 70a may have projections 80a at two locations, including the area where the lead conductor 54a projects from the bottom face 12 of the substrate body 10, and an area adjacent to this area. Similarly, the external electrodes 72a, 70b, 72b may each have projections 82a, 80b or 82b, respectively, at two locations, including the area where the lead conductor 56a, 54b or 56b projects from the bottom face 12 of the substrate body 10, and an area adjacent to this area. In this case, the number of projections that bite into the solder on the circuit board as the coil component 210 is mounted onto the circuit board increases, and therefore misalignment problems of the coil component 210 at mounting can be prevented in an effective manner.

Example 3

Figure 10A:
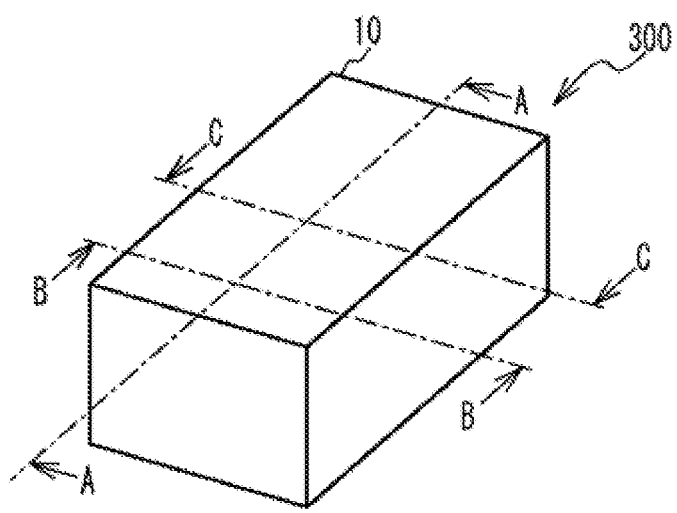
Figure 10B:
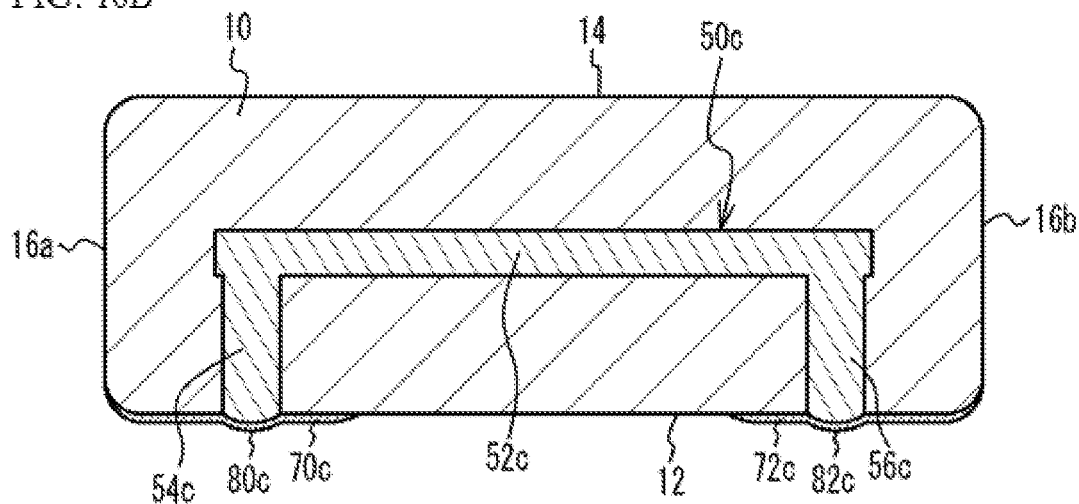
FIGS. 10B to 10D are views of cross-section A-A to cross-section C-C in FIG. 10A, respectively.
Figure 10C:
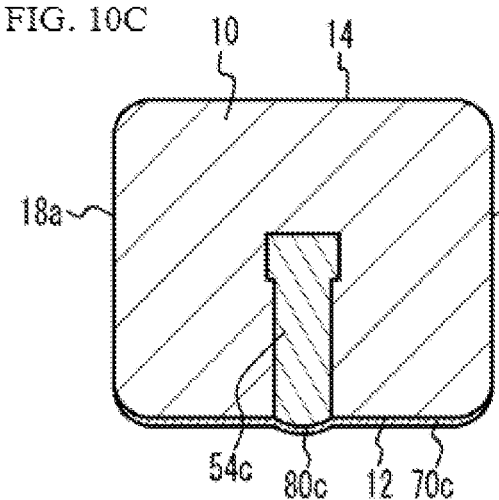
Figure 10D:
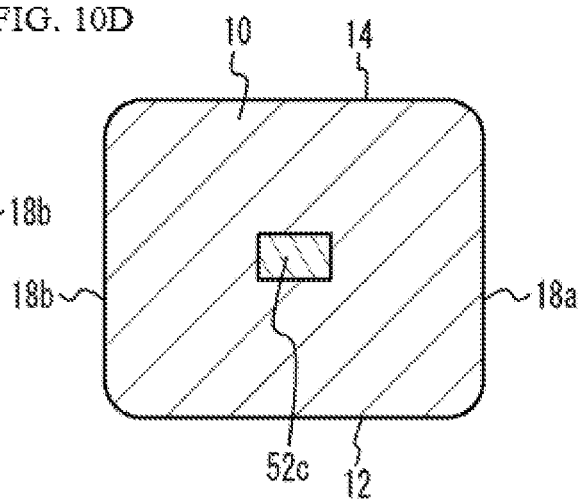

FIG. 10A is a perspective view of the coil component pertaining to Example 3, while FIGS. 10B to 10D are views of cross-section A-A to cross-section C-C in FIG. 10A, respectively. As shown in FIGS. 10A to 10D, the coil component 300 in Example 3 is such that an internal conductor 50c, which includes a straight coil conductor 52c forming a coil and lead conductors 54c, 56c led out from the two end parts of the coil conductor 52c, is built into the substrate body 10. The lead conductors 54c, 56c are led out straight toward the bottom face 12 of the substrate body 10, and their end parts project from the bottom face 12 of the substrate body 10. The external electrodes 70c, 72c, provided on the bottom face 12 of the substrate body 10, have dome-shaped projections 80c, 82c that are formed as a result of the lead conductors 54c, 56c projecting from the bottom face 12 of the substrate body 10. The other constitutions are the same as those in Example 1 and therefore not explained.

Examples 1 and 2 illustrated examples where the coil conductors 52, 52a, 52b, each forming a coil, extend helically; as illustrated by Example 3, however, the coil conductor 52c that forms a coil may extend straight.

Figure 11:
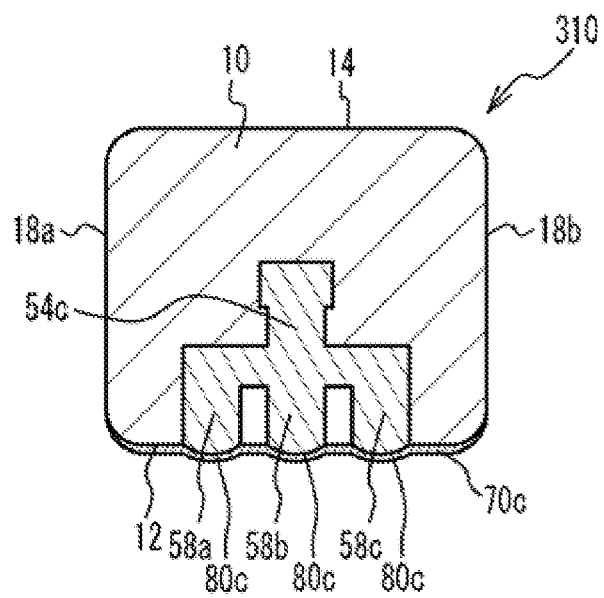
FIG. 11 is a cross-sectional view of the coil component pertaining to Variation Example 1 of Example 3.

FIG. 11 is a cross-sectional view of the coil component pertaining to Variation Example 1 of Example 3. FIG. 11 is a view of a cross-section corresponding to B-B in FIG. 10A. As shown in FIG. 11, the coil component 310 in Variation Example 1 of Example 3 is such that its lead conductor 54c branches into three conductors 58a to 58c, and the end parts of the conductors 58a to 58c project from the bottom face 12 of the substrate body 10, respectively. The external electrode 70c has three projections 80c, respectively formed as a result of the conductors 58a to 58c projecting from the bottom face 12 of the substrate body 10. The other constitutions are the same as those in Example 3 and therefore not explained.

As shown in Variation Example 1 of Example 3, the lead conductor 54c may be led out to the bottom face 12 of the substrate body 10 after branching into multiple conductors 58a to 58c, and the end parts of the multiple conductors 58a to 58c may project from the bottom face 12 of the substrate body 10, respectively. Also, multiple projections 80c may be formed on the external electrode 70c as a result of the external electrode 70c covering the end parts of the multiple conductors 58a to 58c that project from the substrate body 10. This way, the number of projections that bite into the solder on the circuit board as the coil component 310 is mounted onto the circuit board, can be increased, and therefore misalignment problems of the coil component 310 at mounting can be prevented in an effective manner. Also, the external electrode 70c contacts each of the multiple conductors 58a to 58c, allowing the contact area between the external electrode 70c and the lead conductor 54c to be increased. As a result, good electrical connection can be achieved between the external electrode 70c and the lead conductor 54c.

When the lead conductor 54c projects from the bottom face 12 of the substrate body 10 after branching into three conductors 58a to 58c, preferably the lead conductor 56c also projects from the bottom face 12 of the substrate body 10 after branching into three conductors. This way, the three projections 80c formed on the external electrode 70c, and the three projections 82c formed on the external electrode 72c, can be provided at positions symmetrical to one another with respect to the center of the bottom face 12 of the substrate body 10. As a result, any irregular tilting of the coil component that may otherwise occur when the external electrodes 70c, 72c are pressed against the solder applied to the circuit board, can be prevented.

Example 4

Figure 12A:
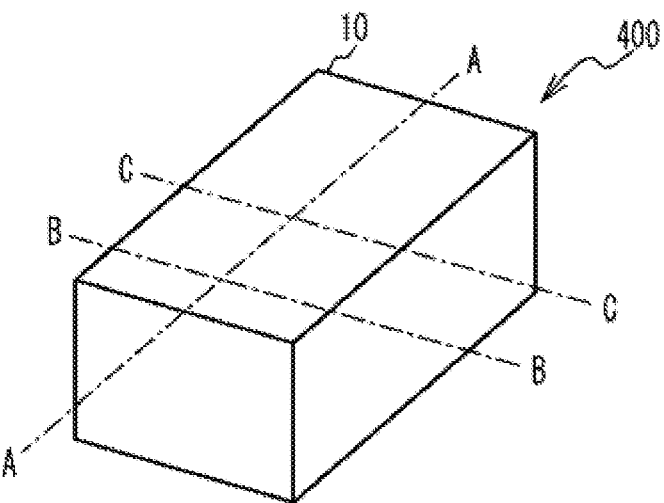
Figure 12B:
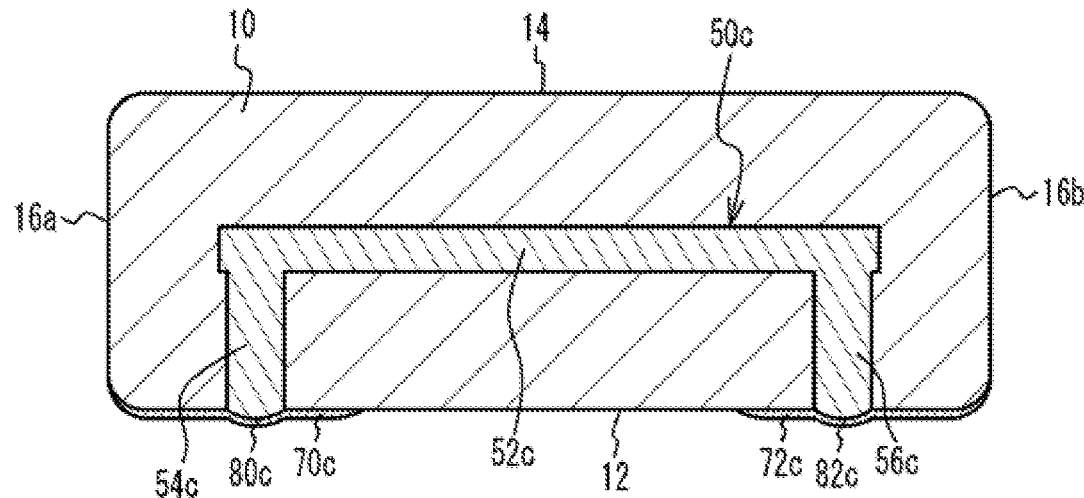
FIGS. 12B to 12D are views of cross-section A-A to cross-section C-C in FIG. 12A, respectively.
Figure 12C:
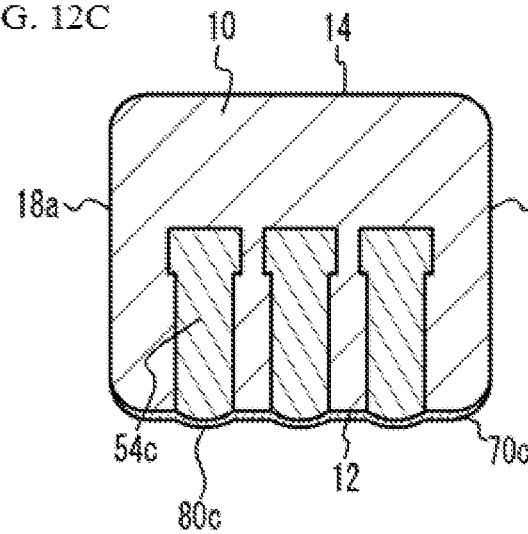
Figure 12D:
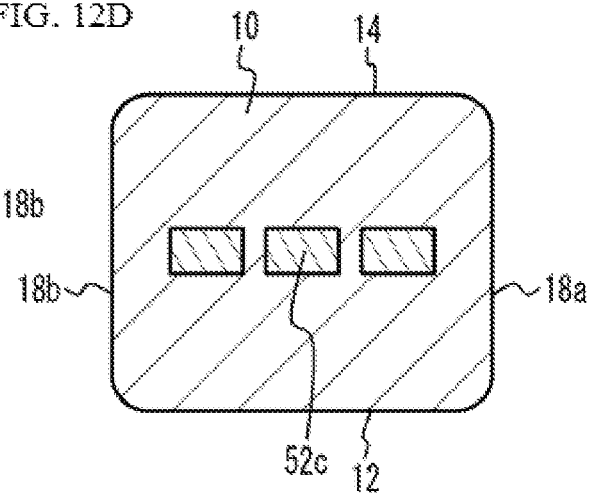

FIG. 12A is a perspective view of the coil component pertaining to Example 4, while FIGS. 12B to 12D are views of cross-section A-A to cross-section C-C in FIG. 12A, respectively. The coil component 300 in Example 3 represented an example where one straight coil conductor 52c is provided in the substrate body 10, as shown in FIGS. 10A to 10D. With the coil component 400 in Example 4, on the other hand, three straight coil conductors 52c are provided in the substrate body 10, as shown in FIGS. 12A to 12D. The other constitutions are the same as those in Example 3 and therefore not explained.

As illustrated in Example 4, the number of straight coil conductor(s) 52c provided in the substrate body 10 is not limited to one, and it may be three or more in number.

Example 5

Figure 13A:
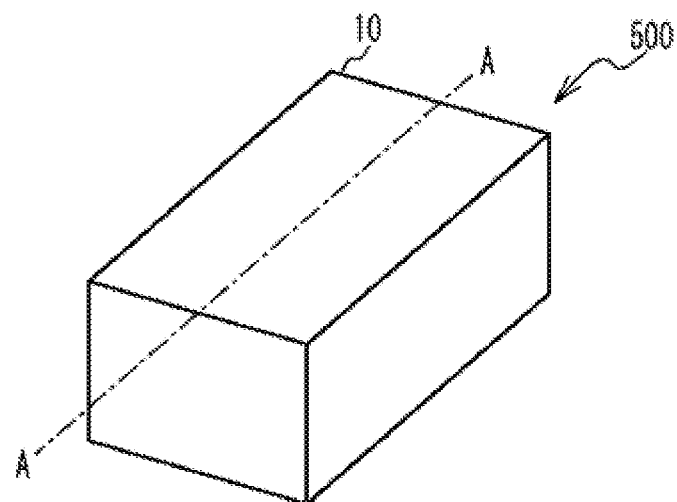
Figure 13B:
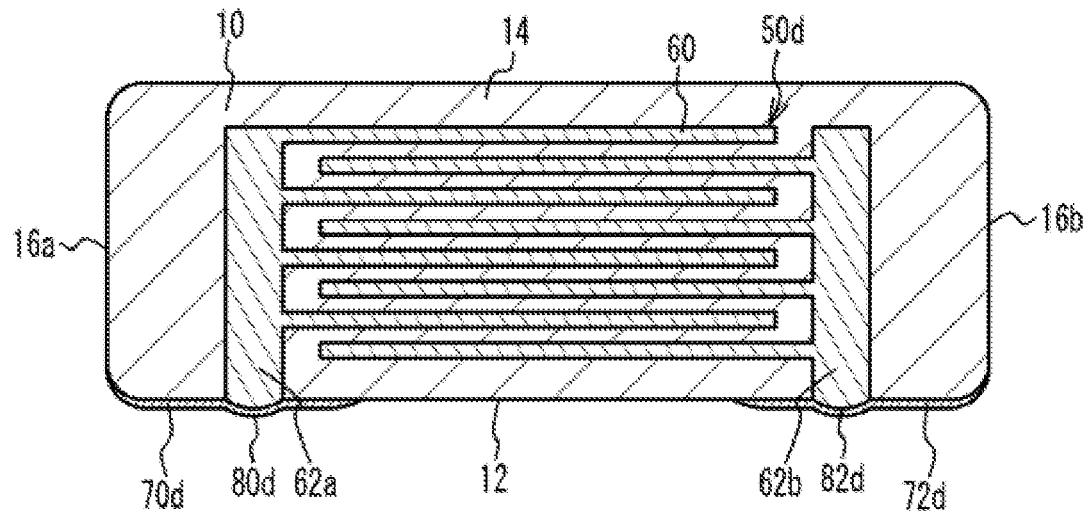
FIG. 13B is a view of cross-section A-A in FIG. 13A.

Example 5 represents an example where the passive component is a capacitor component. FIG. 13A is a perspective view of the capacitor component pertaining to Example 5, while FIG. 13B is a view of cross-section A-A in FIG. 13A. As shown in FIGS. 13A and 13B, the capacitor component 500 in Example 5 is such that an internal conductor 50d, which includes a capacitor conductor 60 forming a capacitor and lead conductors 62a, 62b led out from the capacitor conductor 60, is provided in the substrate body 10. The lead conductors 62a, 62b are led out straight toward the bottom face 12 of the substrate body 10, and their end parts project from the bottom face 12 of the substrate body 10. The external electrodes 70d, 72d, provided on the bottom face 12 of the substrate body 10, have dome-shaped projections 80d, 82d that are formed as a result of the lead conductors 62a, 62b projecting from the bottom face 12 of the substrate body 10. With the capacitor component 500, the substrate body 10 is formed by, for example, barium titanate ($BaTiO_3$), calcium titanate ($CaTiO_3$), strontium titanate ($SrTiO_3$), etc. The capacitor conductor 60 is formed by, for example, nickel, palladium, silver palladium, or other metal material. Just like the capacitor conductor 60, the lead conductors 62a, 62b are also formed by nickel, palladium, silver palladium, or other metal material, for example; however, copper, silver, or other metal may be used in areas between the conductors where electric potential difference does not generate. The other constitutions are the same as those in Example 1 and therefore not explained.

Examples 1 to 4 illustrated examples where the internal conductor built into the substrate body 10 includes a coil conductor that forms a coil; as illustrated by Example 5, however, it may include a capacitor conductor 60 that forms a capacitor. It should be noted that the internal conductor built into the substrate body 10 may also include a conductor that forms, for example, a thermistor, varistor, or the like.

In Examples 1 to 5, the external electrodes are not limited to monohedral electrodes that are provided only on the bottom face 12, which is the mounting surface, of the substrate body 10. For example, the external electrodes may be dihedral electrodes that are provided on the bottom face 12 and top face 14 of the substrate body 10 and electrically connected with thorough electrodes penetrating through the substrate body 10. In this case, the passive component can be mounted with its top face and bottom face positioned upside down, onto the circuit board and still achieve electrical connections. For example, the external electrodes may be L-shaped electrodes that extend from the bottom face 12 of the substrate body 10 onto areas of the end face(s) 16*a* and/or 16*b* for solder-lifting (i.e., a solder flows over the areas). In this case, solder fillets do not generate as the passive component is mounted onto the circuit board, and because the solder wets the end face(s) 16*a* and/or 16*b*, the joining strength can be improved without increasing the footprint.

Example 6

Figure 14:
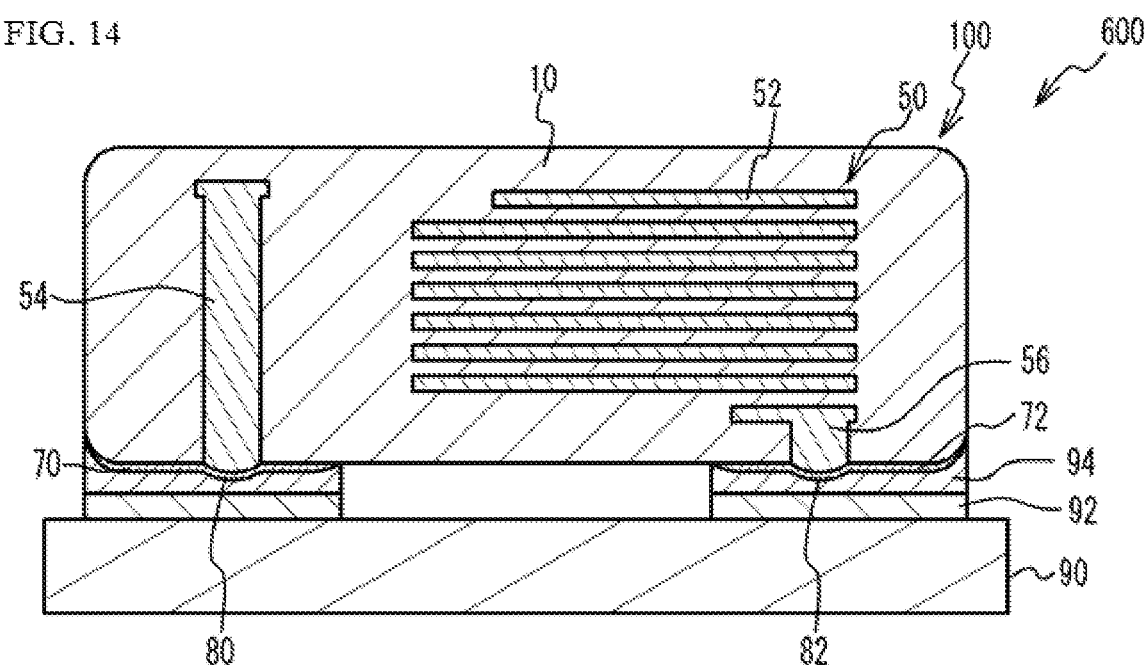
FIG. 14 is a cross-sectional view of the electronic device pertaining to Example 6.

FIG. 14 is a cross-sectional view of an electronic device pertaining to Example 6. As shown in FIG. 14, the electronic device 600 in Example 6 comprises a circuit board 90 and a coil component 100 according to Example 1 mounted on the circuit board 90. The coil component 100 is mounted onto the circuit 90 by joining its external electrodes 70, 72, using solder 94, to the land patterns 92 provided on the circuit board 90.

According to Example 6, where the external electrodes 70, 72 have projections 80, 82 formed on them, the external electrodes 70, 72 are joined to the solder 94 with the projections 80, 82 biting into the solder. This way, misalignment problems of the coil component 100 at mounting on the circuit board 90 can be prevented. It should be noted that, while Example 6 illustrates an example where the coil component 100 in Example 1 is mounted on the circuit board 90, any of the coil components in Variation Example 1 of Example 1 to Example 4 and capacitor component in Example 5 may be mounted on the circuit board 90.

It should be noted that, in the pre-reflow stage, preferably the thicknesses of the solder 94 applied to the land patterns 92 on the circuit board 90 are between 100% and 200% of the heights of the projections 80, 82. For example, the solder 94 thickness is approx. 10 μm to 40 μm before reflow, and 15 μm in one example.

The foregoing described the examples of the present invention in detail; however, the present invention is not limited to these specific examples and various modifications and changes can be made to the extent that they do not affect the key points of the present invention described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2018-065809, filed Mar. 29, 2018, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A passive component being a surface mounting component, comprising: a substrate body having insulation property; an internal conductor embedded in the substrate body, the internal conductor including a coil conductor; and an external electrode provided on a mounting surface of the substrate body and electrically connected to the internal conductor; wherein the external electrode has a planar principal face substantially parallel with the mounting surface of the substrate body, and a dome-shaped projection that bulges in an outward direction from the planar principal face away from the mounting surface of the substrate body, and wherein the internal conductor has a lead conductor contacting and extending parallel to an axis of the coil conductor, inside the substrate body, from an end part of the internal conductor in the outward direction out to the mounting surface of the substrate body and connected to the external electrode, an end part of the lead conductor projects from the mounting surface of the substrate body, and the projection is formed as a result of the external electrode covering the end part of the lead conductor.

2. The passive component according to claim 1, wherein the projection is a bulge constituted by a spherical segment.

3. The passive component according to claim 1, wherein the external electrode has multiple projections that each correspond to the aforementioned projection.

4. The passive component according to claim 1, wherein multiple external electrodes, each corresponding to the aforementioned external electrode having the projection, are provided on the mounting surface of the substrate body.

5. The passive component according to claim 4, wherein the projection of a first external electrode, and the projection of a second external electrode, among the multiple external electrodes, are provided at positions rotationally symmetrical to each other with respect to a center of the mounting surface of the substrate body.

6. The passive component according to claim 4, wherein the mounting surface of the substrate body has a pair of short sides and a pair of long sides, and the projection of the first external electrode, and the projection of the second external electrode, among the multiple external electrodes, are provided at positions linearly symmetrical to each other with respect to a center line running through respective centers of the pair of long sides of the mounting surface of the substrate body.

7. The passive component according to claim 1, wherein the external electrode is formed by materials that contain nickel.

8. The passive component according to claim 1, wherein the external electrode has the projection at a position away from sides constituting the mounting surface of the substrate body.

9. The passive component according to claim 1, wherein the lead conductor is led out to the mounting surface of the substrate body after branching into multiple conductors, respective end parts of the multiple conductors project from the mounting surface of the substrate body, and the projections are formed as a result of the external electrode covering the respective end parts of the multiple conductors.

10. An electronic device comprising:
   the passive component according to claim 1; and
   a circuit board having a land pattern;
   wherein the external electrode of the passive component is joined to the land pattern of the circuit board using solder.

* * * * *